United States Patent [19]
Williams et al.

[11] Patent Number: 5,523,700
[45] Date of Patent: Jun. 4, 1996

[54] QUANTITATIVE TWO-DIMENSIONAL DOPANT PROFILE MEASUREMENT AND INVERSE MODELING BY SCANNING CAPACITANCE MICROSCOPY

[75] Inventors: Clayton C. Williams; Yunji Huang, both of Salt Lake City, Utah

[73] Assignee: University of Utah Research Foundation, Salt Lake City, Utah

[21] Appl. No.: 408,893

[22] Filed: Mar. 22, 1995

[51] Int. Cl.⁶ .................................................. G01R 29/12
[52] U.S. Cl. .......................... 324/765; 324/662; 324/458; 324/663; 324/689; 324/671; 250/306
[58] Field of Search ...................................... 324/765, 458, 324/662, 663, 689, 671; 250/306

[56] References Cited

U.S. PATENT DOCUMENTS 5,065,103  11/1991  Slinkman et al. ....................... 324/458

Primary Examiner—Kenneth A. Wieder
Assistant Examiner—Barry C. Bowser
Attorney, Agent, or Firm—Terry M. Crellin

[57] ABSTRACT

Quantitative dopant profile measurements are performed on a nanometer scale by using a scanning capacitance microscope. A nanometer scale tip of the microscope is positioned at a semiconductor surface, and local capacitance change is measured as a function of sample bias. The method incorporates a feedback system and procedure in which the magnitude of the AC bias voltage applied to the sample is adjusted to maintain a constant capacitance change as the tip is scanned across the sample surface. A one dimensional model is used to extract dopant density profiles from the measurements made by the scanning capacitance microscope.

4 Claims, 2 Drawing Sheets

QUANTITATIVE TWO-DIMENSIONAL DOPANT PROFILE MEASUREMENT AND INVERSE MODELING BY SCANNING CAPACITANCE MICROSCOPY

BACKGROUND OF THE INVENTION

1. Field of the Invention

The present invention relates generally to methods for determining material properties by microscopic scanning, and more particularly relates to determination of material properties including dopant profiles of materials using capacitance-voltage techniques.

2. State of the Art

With the shrinkage of semiconductor devices to the submicron level, a great need exists for direct, quantitative, two dimensional dopant profile measurement on a nanometer scale. Direct measurement of two dimensional dopant profile provides a means for improving very large scale integrated process and electrical device simulators. Direct two dimensional profile measurements are needed to accurately calibrate and verify models built into these simulators. Additionally, direct two dimensional measurements can also give rapid feedback to improve control of manufacturing processes and decrease process development time.

There are many one dimensional dopant profiling techniques presently available, such as secondary ion mass spectroscopy, spreading resistance, junction staining and anodic sectioning. These techniques do not provide quantitative two dimensional dopant profile information. The advent of the scanning tunneling microscope and the more recent scanning probe microscope have provided a new direction for direct device characterization on a nanometer scale. The scanning capacitance microscope has, in particular, shown great potential for direct measurement of two dimensional dopant profile with nanometer scale spacial resolution.

The measurement of local dopant density was disclosed in U.S. Pat. No. 5,065,103 which issued on Nov. 12, 1991. The general method of measuring local capacitance and a generic inversion algorithm are disclosed in this patent. Also disclosed is the use of an atomic force microscope to position the probe at the surface of the semiconductor sample that is to be characterized.

Since the issuance of U.S. Pat. No. 5,065,103, it has been found that the inversion of scanning capacitance microscope data to dopant profile is extremely difficult by the methods described in that patent. In fact, it has not been possible to achieve a quantitative agreement between scanning capacitance microscope measured profiles and the actual dopant profiles, at least when using a one dimensional model as a basis for determining dopant density profiles from the data produced by the scanning capacitance microscope.

The source of the problem to achieve quantitative inversion is that as the tip of the scanning capacitance microscope moves from a region of high dopant density to one of low dopant density, the amount of depletion of majority carriers beneath the tip due to voltage applied between the tip and the sample varies significantly. In regions of high dopant density, the depth of depletion of majority carriers may be small compared to the tip radius. In regions of lower dopant density, the depth of depletion of majority carriers may be comparable or larger than the tip size. In order to quantitatively invert the scanning capacitance microscope data under these conditions, a three dimensional model of the tip/sample interaction is required. Since the exact size and shape of the tip are typically unknown, inversion based upon the three dimensional model is very difficult. It would be highly desirable to provide a method of using a scanning capacitance microscope in which the data obtained from the microscope could be quantitatively inverted to dopant profile using a simplified one dimensional model as a basis for the inversion.

OBJECTIVE AND BRIEF DESCRIPTION OF THE INVENTION

The principal objective of the present invention is to provide an improvement in the basic method as disclosed in U.S. Pat. No. 5,065,103 wherein quantitative inversion of data from the scanning capacitance microscope can be achieved by using a novel feedback system and procedure incorporated into the method.

The present invention comprises a novel improvement in the method disclosed in U.S. Pat. No. 5,065,103, and the entire contents of that patent are incorporated herein by reference. The novel feedback system and procedure of the present invention controls the AC bias voltage applied to the tip of the scanning capacitance microscope so that the capacitance change due to depletion of majority carriers beneath the tip of the microscope resulting from the AC bias remains constant as the tip of the microscope moves across the surface of the sample. This means that the peak depletion depth of majority carriers beneath the tip remains approximately constant as the tip moves from a region of high dopant density to a region which is lightly doped.

The depletion depth can further be controlled so that it is kept smaller than the radius of the tip of the scanning capacitance microscope, and it has been found that by maintaining the depletion depth small in comparison to the radius of the tip of the microscope, the capacitance data can be inverted using an algorithm based on a one dimensional model. The feedback system and procedure of the present invention result in the ability to quantitatively invert the capacitance data from the scanning capacitance microscope based on a one dimensional model. This has not been possible heretofore.

Additional objects and features of the invention will become apparent from the following detailed description, taken together with the accompanying drawings.

THE DRAWINGS

A preferred embodiment of the present invention representing the best mode presently contemplated of carrying out the invention is illustrated in the accompanying drawings in which:

FIG. 1 is a block diagram of the scanning capacitance microscope and new feedback system in accordance with the present invention; and FIG. 2 is a graph of dopant profile, shown in solid line, of a sample tested using the improved method of the present invention, with the actual, known profile of the same sample shown in dashed line.

DETAILED DESCRIPTION OF THE ILLUSTRATED EMBODIMENT

In accordance with the present invention, an improvement is provided for the basic method of using a scanning capacitance microscope which was disclosed in U.S. Pat. No. 5,065,103. By using the improved system and procedure of the present invention, quantitative inversion of the data obtained from the scanning capacitance microscope can be achieved by the simple use of a one dimensional model to analyze that data.

In the basic method disclosed in U.S. Pat. No. 5,065,103, a constant AC bias voltage is applied between the tip of the scanning capacitance microscope and the semiconductor sample. In the present invention, the AC bias voltage applied to the tip is continuously adjusted by a novel feedback loop (as will be described below), so that the capacitance change due to depletion of majority carriers in the sample due to the AC bias remains substantially constant as the tip moves across the surface of the sample.

It has been found that by using the novel feedback system and procedure of the present invention, it is possible to control the depletion depth of the majority carriers so that the depletion depth is kept smaller than the radius of the tip of the scanning capacitance microscope. As a result, the inversion of the data from the scanning capacitance microscope to dopant density can be achieved with good accuracy using a one dimensional model. Without the novel improvement of the present invention, the three dimensional character of the tip and the depletion volume must be accounted for, and this accounting is very difficult.

Figure 1:
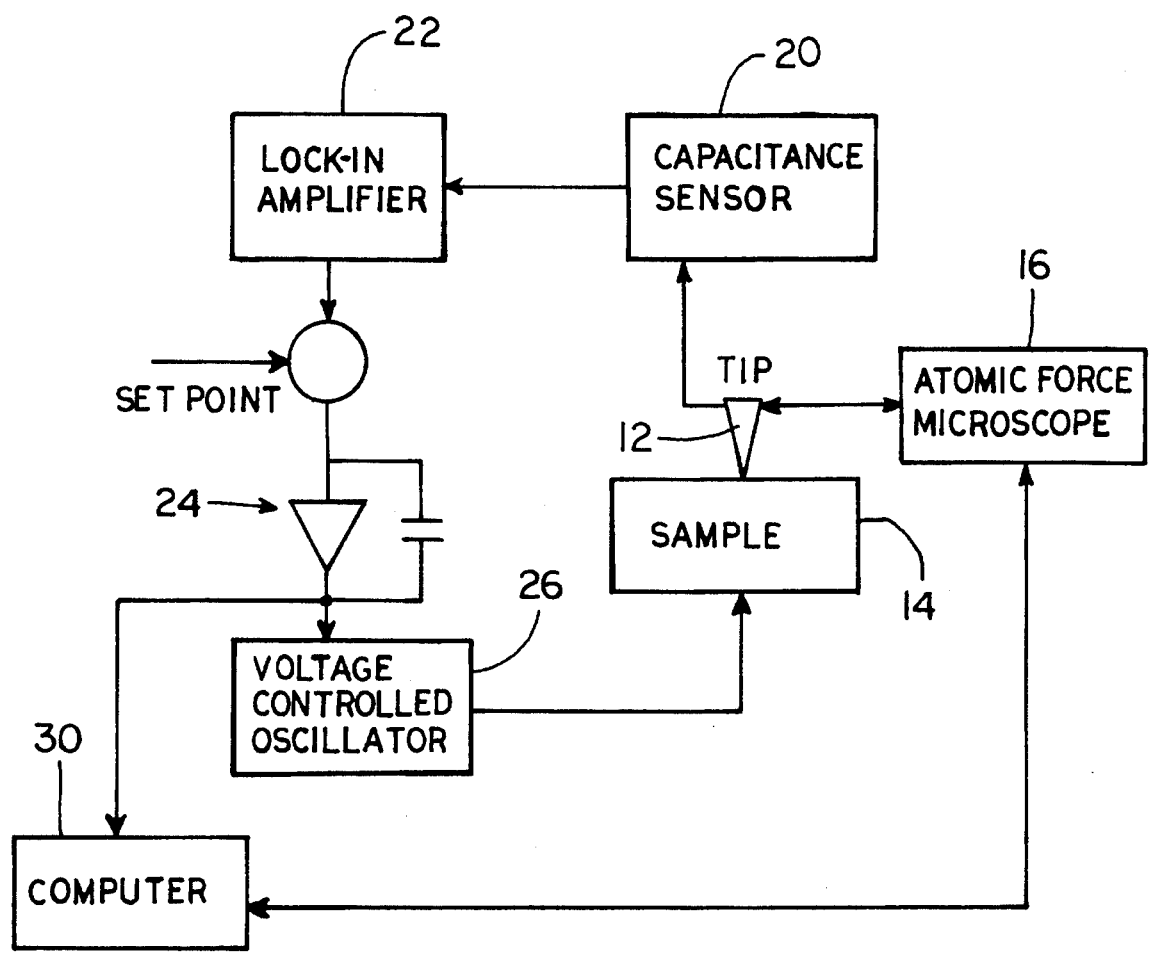

The present invention involves an improvement in the method disclosed in U.S. Pat. No. 5,065,103. In that method, an atomic force microscope and a scanning capacitance microscope are used in combination. A block diagram showing the method with the improvement of the present invention is shown in FIG. 1. A tungsten tip 12 of the scanning capacitance microscope is brought to the surface of a semiconductor sample 14. A contact mode atomic force microscope 16 is used to position and scan the tip 12 over the surface of the sample 14. A high sensitivity capacitance sensor 20 is connected to the tip 12 to measure the capacitance between the tip 12 and the sample 14. The tip 12 is grounded at low frequencies with an inductor (not shown).

An AC bias is applied between the sample 14 and the tip 12. In the method of U.S. Pat. No. 5,065,103, a constant AC voltage is applied. In accordance with the present invention, a novel feedback system and procedure is provided wherein the AC bias voltage applied to the tip is continuously adjusted. In the improvement of the present invention, the tip/sample capacitance associated with the AC bias voltage is measured by the capacitance sensor 20 and detected by a lock-in amplifier 22. The detected signal from the lock-in amplifier 22 is compared to a reference voltage, a set point, and sent to a feedback controller.

The feedback controller advantageously comprises an integrator circuit 24 and a voltage controlled oscillator 26. The integrator circuit 24 ramps the signal from the lock-in amplifier either by increasing the signal or decreasing the signal in accordance with the comparison of the signal with the set point or reference voltage. The signal from the lock-in amplifier is then fed to the voltage controlled oscillator 26 which generates an AC voltage whose magnitude is controlled by the input signal to the voltage controlled oscillator 26.

The AC voltage from the voltage controlled oscillator 26 is the AC bias that is applied between the tip 12 of the scanning capacitance microscope and the sample 14. By controlling the AC bias, the capacitance change due to depletion of majority carriers resulting from the AC bias remains constant as the tip 12 moves across the surface of the sample 14. The feedback signal to the voltage controlled oscillator 26, i.e. the signal from the integrator circuit 24 is recorded by a computer 30, and the topography signal from the atomic force microscope 16 is also recorded by the computer 30. The measurements from the scanning capacitance microscope can thus be directly correlated with the topographic surface profile.

Under the novel feedback system and procedure of the present invention, the depletion depth of majority carriers beneath the tip 12 should remain approximately the same for regions of different dopant density. If the depletion depth chosen by the set point (the reference voltage mentioned previously) is small compared to the radius of the tip 12 of the scanning capacitance microscope, a one dimensional model can be used with good accuracy to invert the data from the scanning capacitance microscope to dopant profile. In the one dimensional model, the tip 12 is represented by a conducting sphere in contact with an oxide on a conducting plane. The whole surface plane of the sample 14 is divided into narrow annuli around the contact between the tip 12 and the sample 14.

For each annular radius, the effective insulator capacitance (oxide and air) is calculated by the method of images assuming no depletion. Once the effective gap capacitances are known for each radius, the depletion capacitance in the silicon is calculated for each annular region using a simple one dimensional band bending model as disclosed by E. H. Nicollian and J. R. Brews, in *MOS Physics and Technology* printed by Wiley, New York, 1982. The total capacitance for each annular region is obtained by adding, in series, the effective insulator capacitance and the silicon depletion capacitance for that annular region at a given tip/sample bias voltage. The total tip/sample capacitance is obtained by integrating the capacitance contribution of each of these annular regions. The tip/sample capacitance is a function of tip bias, tip radius, dielectric thickness, dopant density and annular radius, and the dopant density can be determined by a simple analysis of this function.

Figure 2:
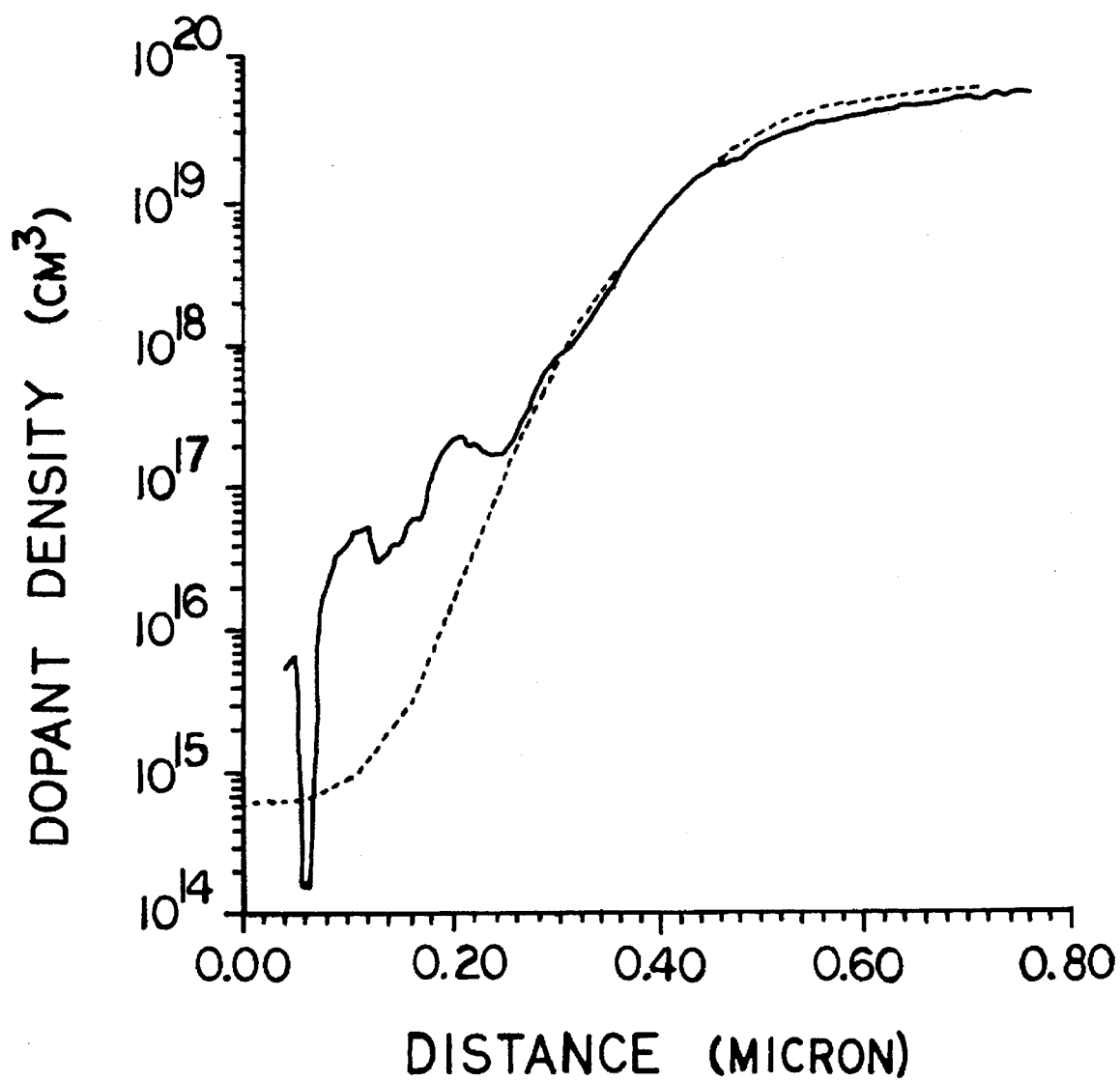

To demonstrate the usefulness and accuracy of the novel feed back system and procedure of the present invention, a series of scanning capacitance microscope measurements were made using the feedback method described herein. The measurements were made on a known sample prepared by International Business Machines Corporation. The curves for dopant density as determined by the method of the present invention are shown in FIG. 2 along with the curve for the dopant density predicted by SUPREM IV, a well established process simulator marketed by Technology Modeling Associates, Palo Alto, Calif. There is a substantially ideal agreement in the curves for dopant densities above $1 \times 10^{17}/cm^3$. This is the range of dopant densities which is predicted to be most technologically significant for semiconductor structures.

Although a preferred embodiment of the improved method of the present invention has been illustrated and described, it is to be understood that the present disclosure is made by way of example and that various other embodiments are possible without departing from the subject matter coming within the scope of the following claims, which subject matter is regarded as the invention.

We claim:

1. In a method for determining dopant density of a semiconductor material with respect to a least two dimensions, wherein said method comprises the steps of (a) scanning a fine tip in close proximity to a surface of said material within a predetermined scan area, (b) applying an AC voltage to said tip with respect to said material, (c) measuring a parameter corresponding to the capacitance in a region of said material near said tip at a plurality of locations within said scan area, and (d) relating the parameter values and the AC voltage levels applied to said tip with respect to said material according to a predetermined relationship to derive said dopant density at each of the locations, the improvement comprising measuring an AC parameter corresponding to the capacitance in a region of said material near said tip;

feeding the AC parameter corresponding to the capacitance to a lock in amplifier;

comparing the output of the lock in amplifier to a set value;

generating a feedback signal that corresponds to the comparison of the output of the lock in amplifier to said set value;

using the feedback signal to control the AC voltage applied to said tip with respect to said material in accordance with the comparison of the output of the lock in amplifier to said value so that the output of the lock in amplifier is maintained at a substantially constant value determined by said set value to which it is compared, whereby capacitance change due to depletion depth of majority carriers at the tip resulting from the AC bias voltage remains substantially constant as the tip scans the surface of said material; and utilizing the feedback signal to determine dopant density for each of the locations.

2. A method in accordance with claim 1 wherein the AC parameter corresponding to the capacitance in a region of said material near said tip is an AC signal produced by a high sensitivity capacitance sensor which is connected electronically to said tip and measures the capacitance between the tip and said material;

the AC parameter consisting of the AC signal produced by the high sensitivity capacitance sensor is fed to said lock in amplifier, and the lock in amplifier produces a DC signal corresponding to said AC parameter;

said DC signal is compared with said set value, and an integrator circuit continuously produces an adjusted DC signal in accordance with the comparison between the DC signal and said set value;

the adjusted DC signal is fed to a voltage controlled oscillator which produces a controlled AC voltage that is applied to said tip with respect to said material.

3. A method in accordance with claim 2 wherein said set value corresponds to a depletion depth of majority carriers in a region of said material near said tip that is small compared to the tip size.

4. A method in accordance with claim 2 wherein said adjusted DC signal produced by said integrator circuit is the feedback signal that is used in determining the dopant density.

* * * * *